(12) United States Patent
Shim et al.

(10) Patent No.: US 9,996,801 B2
(45) Date of Patent: Jun. 12, 2018

(54) MICROWAVE-FREE CONTROL OF A SUPERCONDUCTOR-BASED QUANTUM COMPUTER

(71) Applicant: UNIVERSITY OF MARYLAND, COLLEGE PARK, College Park, MD (US)

(72) Inventors: Yun-Pil Shim, Eldersburg, MD (US); Charles George Tahan, Silver Spring, MD (US)

(73) Assignees: University of Maryland, College Park, College Park, MD (US); The United States of America, as represented by the Director, National Security Agency, Washington, DC (US)

( * ) Notice: Subject to any disclaimer, the term of this patent is extended or adjusted under 35 U.S.C. 154(b) by 0 days. days.

(21) Appl. No.: 15/214,757

(22) Filed: Jul. 20, 2016

(65) Prior Publication Data

US 2017/0116542 A1    Apr. 27, 2017

Related U.S. Application Data

(60) Provisional application No. 62/194,592, filed on Jul. 20, 2015.

(51) Int. Cl.
*G11C 11/44*  (2006.01)
*G06N 99/00*  (2010.01)

(52) U.S. Cl.
CPC ............ *G06N 99/002* (2013.01); *G11C 11/44* (2013.01)

(58) Field of Classification Search
CPC ........ G06N 99/002; G11C 11/44; H03K 3/39; H01K 29/122; H01L 39/00; H04L 9/0852
USPC ....... 365/160, 162, 106, 129; 257/31, 34, 36
See application file for complete search history.

(56) References Cited

U.S. PATENT DOCUMENTS

| | | | |
|---|---|---|---|
| 7,307,275 B2 * | 12/2007 | Lidar ..................... | B82Y 10/00 257/31 |
| 9,256,834 B2 * | 2/2016 | Bonderson ........... | G06N 99/002 |
| 2015/0358022 A1 * | 12/2015 | McDermott, III . | H03K 19/1958 326/5 |

OTHER PUBLICATIONS

Barends et al., "Coherent Josephson qubit suitable for scalable quantum integrated circuits," *Physical Review Letters*, Aug. 2013, 111(8): 080502(5).

Barends et al., "Superconducting quantum circuits at the surface code threshold for fault tolerance," *Nature*, Apr. 2014, 508: pp. 500-503.

(Continued)

*Primary Examiner* — David Lam
(74) *Attorney, Agent, or Firm* — Shapiro, Gabor and Rosenberger, PLLC

(57) ABSTRACT

Physical superconducting qubits are controlled according to an "encoded" qubit scheme, where a pair of physical superconducting qubits constitute an encoded qubit that can be controlled without the use of a microwave signal. For example, a quantum computing system has at least one encoded qubit and a controller. Each encoded qubit has a pair of physical superconducting qubits capable of being selectively coupled together. Each physical qubit has a respective tunable frequency. The controller controls a state of each of the pair of physical qubits to perform a quantum computation without using microwave control signals. Rather, the controller uses DC-based voltage or flux pulses.

25 Claims, 7 Drawing Sheets

(56) References Cited

OTHER PUBLICATIONS

Blais et al., "Cavity quantum electrodynamics for superconducting electrical circuits: an architecture for quantum computation," arXiv:cond-mat/0402216v1 [cond-mat.mes-hall] [online], Feb. 2004 [retrieved on Sep. 7, 2017]. Retrieved from the Internet: <URL: https://arxiv.org/abs/cond-mat/0402216v1>.

De Lange et al., "Realization of microwave quantum circuits using hybrid superconducting-semiconducting nanowire Josephson elements," *Physical Review Letters*, Sep. 2015, 115(12): 127002(5).

Dicarlo et al., "Demonstration of two-qubit algorithms with a superconducting quantum processor," *Nature*, Jul. 2009, 460: pp. 240-244.

Geller et al., "Tunable coupler for superconducting Xmon qubits: Perturbative nonlinear model," *Physical Review A*, Jul. 2015, 92(1): 012320(9).

Kelly et al., "State preservation by repetitive error detection in a superconducting quantum circuit," *Nature*, Mar. 2015, 519: pp. 66-69.

Koch et al., "Charge insensitive qubit design derived from the Cooper pair box," arXiv:cond-mat/0703002v2 [cond-mat.mes-hall] [online], Sep. 2007 [retrieved on Sep. 7, 2017.] Retrieved from the Internet: <URL:https://arxiv.org/abs/cond-mat/0703002v2>.

Larsen et al., "Semiconductor-nanowire-based superconducting qubit," *Physical Review Letters*, Sep. 2015, 115(12): 127001(5).

Makhlin et al., "Josephson-junction qubits with controlled couplings," *Nature*, Mar. 1999, 398: pp. 305-307.

Schreier et al., "Suppressing charge noise decoherence in superconducting charge qubits," *Physical Review B*, May 2008, 77(18): 180502(4).

Schuster et al., "AC-Stark shift and dephasing of a superconducting qubit strongly coupled to a cavity field," arXiv:cond-mat/0408367v1 [cond-mat.mes-hall] [online], Aug. 2004 [retrieved on Sep. 7, 2017]. Retrieved from the Internet: <URL: https://arxiv.org/abs/cond-mat/0408367v1>.

Strauch et al., "Quantum logic gates for coupled superconducting phase qubits," arXiv:quant-ph/0303002v2 [online], Oct. 2003 [retrieved on Sep. 7, 2017]. Retrieved from the Internet: <URL: https://arxiv.org/abs/quant-ph/0303002v2>.

Wallraff et al., "Approaching unit visibility for control of a superconducting qubit with dispersive readout," *Physical Review Letters*, Aug. 2005, 95(6): 060501(4).

Wallraff et al., "Strong coupling of a single photon to a superconducting qubit using circuit quantum electrodynamics," *Nature*, Sep. 2004, 431: pp. 162-67.

\* cited by examiner

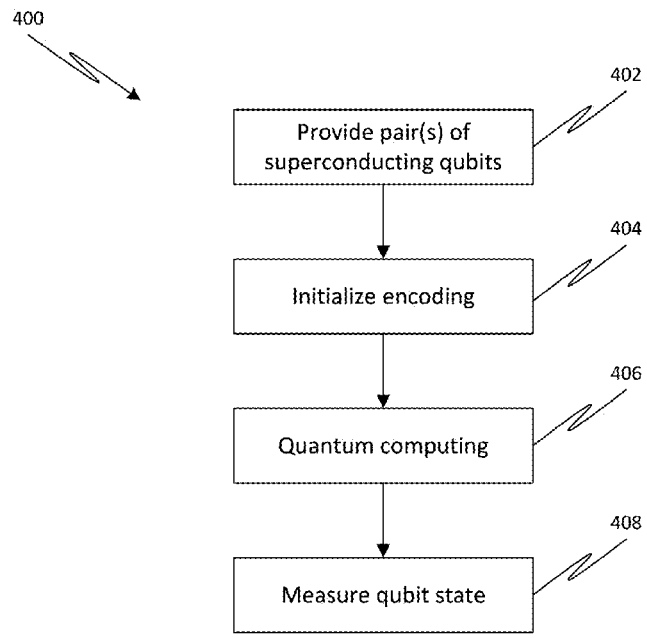
FIG. 4
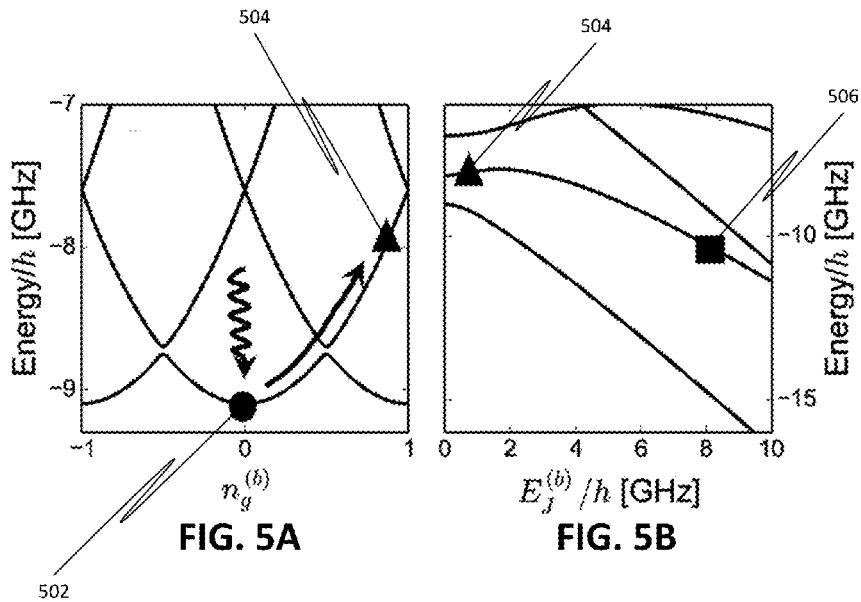
FIG. 5A   FIG. 5B

MICROWAVE-FREE CONTROL OF A SUPERCONDUCTOR-BASED QUANTUM COMPUTER

CROSS-REFERENCE TO RELATED APPLICATIONS

The present application claims the benefit of U.S. Application No. 62/194,592, filed Jul. 20, 2015, which is hereby incorporated by reference herein in its entirety.

STATEMENT REGARDING FEDERALLY SPONSORED RESEARCH

This invention was made with government support under H9823011C0301 awarded by the National Security Agency (NSA). The government has certain rights in the invention.

FIELD

The present disclosure generally relates to quantum computing, and, more particularly, to systems and methods for microwave-free control of the operation of a superconductor-based quantum computer.

SUMMARY

In embodiments, physical superconducting qubits (e.g., a superconducting Josephson junction quantum circuit) are controlled according to an "encoded" qubit scheme. The encoded qubit is embedded logically in a pair of physical superconducting qubits. Unlike conventional superconducting qubit control, the encoded superconducting qubit approach does not require microwave control. Rather, the encoded superconducting qubit approach enables microwave-free control of qubit states via fast DC-like pulses. Thus, the physical qubit frequency (and the corresponding operation of the superconductor-based quantum computer) can be divorced from the corresponding control electronics.

In one or more embodiments, a method comprises controlling operation of a superconductor-based quantum computer without using a microwave signal.

In one or more embodiments, a method comprises providing at least one encoded qubit and controlling the at least one encoded qubit to perform a quantum computation. Each encoded qubit can comprise a pair of physical qubits capable of being selectively coupled together. Each of the physical qubits of the pair has a respective tunable frequency.

In one or more embodiments, a quantum computing system comprises at least one encoded qubit and a controller. Each encoded qubit comprises a pair of physical qubits capable of being selectively coupled together. Each physical qubit has a respective tunable frequency. The controller is configured to control a state of each of the pair of physical qubits to perform a quantum computation and to control said state via microwave-free control signals.

Objects and advantages of embodiments of the disclosed subject matter will become apparent from the following description when considered in conjunction with the accompanying drawings.

BRIEF DESCRIPTION OF THE DRAWINGS

Embodiments will hereinafter be described with reference to the accompanying drawings, which have not necessarily been drawn to scale. Where applicable, some features may not be illustrated to assist in the illustration and description of underlying features. Throughout the figures, like reference numerals denote like elements.

FIG. 4 is a simplified process flow diagram for provision and use of encoded superconducting qubits in quantum computing, according to one or more embodiments of the disclosed subject matter.

FIGS. 5A-5B are energy spectrum diagrams for an encoded qubit during initialization, according to one or more embodiments of the disclosed subject matter.

DETAILED DESCRIPTION

Figure 1:
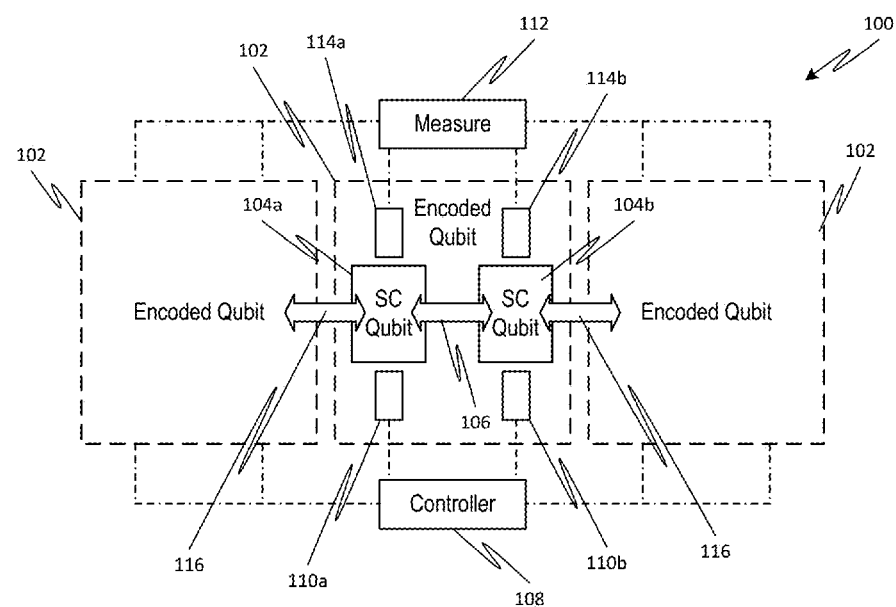
FIG. 1 is a simplified schematic diagram illustrating various aspects of the quantum computing unit employing encoded superconducting qubits, according to one or more embodiments of the disclosed subject matter.

Disclosed herein are novel methods for operating a superconductor-based quantum computer, as well as superconductor-based quantum computing system incorporating such methods. In particular, the disclosed methods avoid the conventional use of microwave-based signals to control operation of superconducting qubits in performing a quantum computation. By providing microwave-free control, the disclosed methods can enjoy certain advantages over conventional methodologies, for example, faster operation and increased design flexibility with respect to control signal generators, among other benefits.

In embodiments, physical superconducting qubits (e.g., a superconducting Josephson junction quantum circuit) are controlled according to an "encoded" qubit scheme. As a result of this scheme (described in further detail below), the encoded qubit is embedded logically in a pair of physical superconducting qubits. The encoded superconducting qubit approach does not require microwave control. Rather, the encoded superconducting qubit approach enables microwave-free control of qubit states via fast DC-like pulses. Thus, the disclosed approach divorces physical qubit frequency (and the corresponding operation of the superconductor-based quantum computer) from the corresponding control electronics.

In embodiments, the superconductor-based quantum computer may use microwave or radio frequency (RF) carrier signals for aspects other than control of the physical qubits, for example, for initialization of the qubits or measurement. However, the control signal applied to gates of the physical qubits remains substantially microwave-free. Thus, as used herein, microwave-free refers to the lack of a microwave carrier wave signal for the gate control of operation of the physical qubits in performing a desired quantum computation. For example, the control signals for operation of the physical qubits are DC-based voltage or flux pulses.

Although encoding has been previously applied to spin qubits, an encoded qubit scheme has not, as of yet, been seriously considered for superconducting qubit operation. In contrast to superconducting qubits, spin qubits are based on the fundamental and intrinsic properties of semiconductor systems, such as electron spins trapped in the potential of a quantum dot or a chemical impurity. To improve operation gate speed, encoding of two to four physical spin qubits was developed, for example, as exchange-only qubits to enable universal quantum computing. However, the present inventors have discovered that applying an encoded qubit scheme to superconducting qubits unexpectedly results in minimal overhead in terms of control operations.

In contrast to encoded superconducting qubits, the application of an encoded qubit scheme to spin qubits results in substantially increased overhead. For example, spins in quantum dots can be assumed to have equivalent g-factors, so that in a magnetic field the frequency of each qubit is the same. Tuning of the respective frequencies of the individual physical spin qubits is usually not available. Thus, to achieve universal quantum computation (i.e., having an ability to do arbitrary rotations around the Bloch sphere plus two-qubit entangling gate), a minimum of three spins are required. In the case of physical spin qubits, an encoded one-qubit gate would require around three pulses and a controlled NOT (CNOT) gate would require roughly twenty pulses—a substantial overhead. While two-qubit encodings for the spin qubits are possible, a magnetic field gradient (for example, via a micro-magnet) would be necessary. In contrast, a superconducting physical qubit can have a frequency that is tunable thereby offering the potential for arbitrary one-qubit rotations of the encoded qubit with just two physical qubits.

Referring to FIG. 1, a simplified schematic diagram illustrates various aspects of an exemplary superconductor-based quantum computer 100. For example, the quantum computer 100 can include a plurality of encoded qubits 102, each encoded qubit being formed by a pair of physical superconducting qubits 104a, 104b. Although three encoded qubits 102 are illustrated in FIG. 1, embodiments of the disclosed subject matter are not limited thereto. Indeed, a quantum computer as disclosed herein may be formed by any number of encoded qubits 102, for example, at least one encoded qubit 102.

Moreover, although the encoded qubits 102 have been illustrated in a 1-D array, embodiments of the disclosed subject matter are not limited thereto. Rather, other configurations are also possible according to one or more contemplated embodiments, such as, but not limited to, a 2-D regular or irregular array, a 3-D regular or irregular array, a circular or spherical array, and a random 2-D or 3-D distribution.

Each of the physical superconducting qubits 104a, 104b can be controlled by a respective control module 110a, 110b. For example, the control module 110a, 110b may be a flux or voltage source that interacts with the superconducting qubit 104a, 104b, to tune an energy or frequency thereof, thereby controlling operation of the superconducting qubits. A control unit 108 can control each of the control modules (e.g., 110a, 110b) in order to control a state of each of the physical superconducting qubits in order to perform a quantum computation. As referenced above, the control of the physical superconducting qubits 110a, 110b via the control unit 108 and control modules 110a, 110b is substantially microwave-free. Instead of microwave signals, the controlling of the superconducting qubit state via the control unit 108 is by applying z-pulses to control respective gates of the pair of superconducting physical qubits, with the z-pulses being, for example, DC-based voltage or flux pulses.

Each of the physical superconducting qubits 104a, 104b can also be provided with respective readout modules 114a, 114b. For example, the readout modules 114a, 114b may be resonators that are coupled to the respective superconducting qubit 104a, 104b. A measuring unit 112 can control each of the readout modules (e.g., 114a, 114b) in order to measure a state of one or more of the physical superconducting qubits. For example, a microwave-based dispersive technique can be applied via the resonators of the readout modules 114a, 114b (for example, transmission line resonators 214a-214d of FIG. 2A).

The physical superconducting qubits 104a, 104b can be selectively coupled to each other, for example, via coupling 106. As used herein, selectively coupled refers to a coupling that can be varied between a first value (e.g., zero or relatively lower coupling) and a second value (e.g., non-zero or relatively higher coupling). For example, a tunable coupler can be provided between physical superconducting qubit 104a and 104b and can adjust the degree of coupling between the physical superconducting qubits, for example, based on signals from control unit 108. Alternatively or additionally, the selective coupling 106 can be a capacitive coupling that is turned on or off based on control of the respective frequencies of the physical superconducting qubits 104a and 104b. When the frequencies of the physical superconducting qubits 104a and 104b are substantially the same the coupling 106 may be at a higher level (e.g., a maximum coupling), whereas when the frequencies of the physical superconducting qubits 104a and 104b are different the coupling 106 may be at a lower level (e.g., a minimum coupling).

In embodiments employing a tunable coupler for the selective coupling, the difference between idle frequencies (i.e., frequency prior to any external tuning) of the physical superconducting qubits 104a, 104b can be relatively small (e.g., zero or no more than 10-20% of the frequency of one of the physical superconducting qubits). However, when the coupling 106 is a capacitive coupling, the difference between the frequencies of the physical superconducting qubits 104a, 104b can be greater than the capacitive coupling to allow sufficient on-off control of the coupling.

The capacitive coupling between superconducting physical qubits is generally constant and determined solely by the geometry of the superconducting physical qubits. As noted above, this coupling is turned on and off by the qubit frequency difference. However, by employing more complicated control circuits, such as those of a gmon architecture, the capacitive coupling can also be made tunable and completely turned off, giving a very large on/off ratio. Such a tunable capacitive coupling may remove, or at least reduce, the need to detune each qubit to avoid unwanted resonances, thereby significantly simplifying the qubit frequency controls during operation (e.g., the CPHASE operation described below). This also allows rotating the encoded qubit around any axis in the full xz plane, reducing the necessary rotation steps to two for any single qubit logical gates.

To enable universal quantum computation, quantum computer 100 should be capable of arbitrary single qubit operations and at least one two-qubit entangling gate operation. The entangling gate operation is between two encoded qubits 102 that are selectively coupled to each other. The z-pulse control via control unit 108 implements the entangling two-qubit operation between the two encoded qubits 102 to enable universal quantum computation, as described in further detail below.

The encoded qubits 102 may be selectively coupled 116 to each other via adjacent ones of their respective physical superconducting qubits. Such coupling 116 may employ the same type of device (e.g., tunable coupler) or methodology (e.g., tuning of frequencies via capacitive coupling) as the coupling 106 between the pair of physical superconducting qubits 104a, 104b within the encoded qubit 102, or a different type of coupling than coupling 106.

The difference between frequencies of the corresponding physical superconducting qubits 104a, 104b determines the idle frequency of the encoded qubit 102. With smaller frequency differences of the physical superconducting qubits, the idle frequency of the encoded qubit 102 is correspondingly smaller thereby leading to a reduced requirement for timing accuracy to operate the encoded qubit 102 (e.g., on the order of hundreds of MHz) as opposed to what would otherwise be necessary to operate the physical superconducting qubits 104a separately (e.g., on the order of several GHz). Among other benefits, engineering requirements for the quantum computer 100, for example, a clock for synchronizing control signals, can thus be relaxed.

Figure 2A:
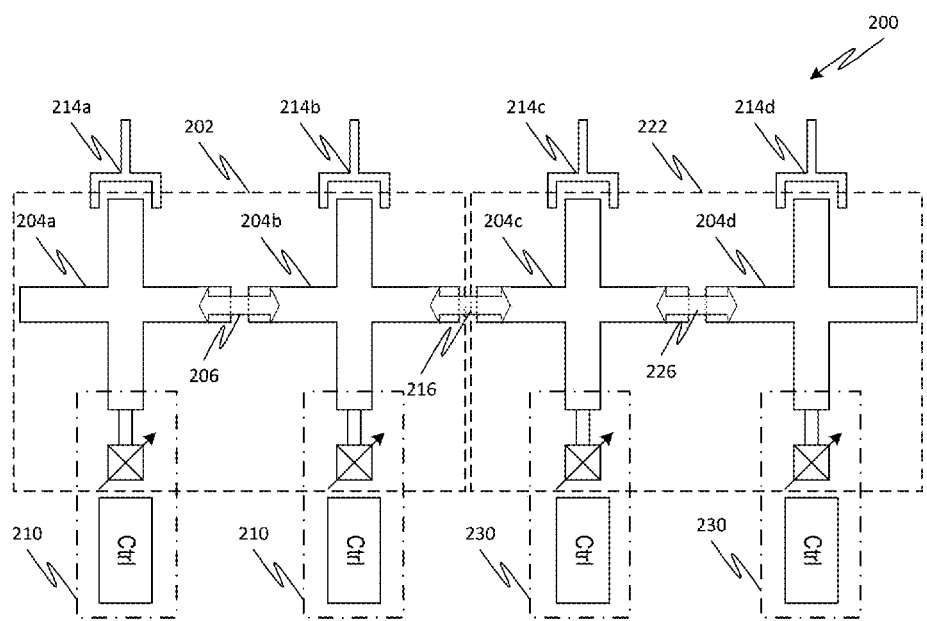
FIG. 2A is a simplified schematic diagram of an encoded superconducting qubit scheme, according to one or more embodiments of the disclosed subject matter.

Referring to FIG. 2A, an exemplary configuration for a two encoded qubit system 200 is shown. The encoded qubit system 200 includes a first encoded qubit 202, with a pair of tunable physical superconductor qubits 204a, 204b (also referred to herein as 1a, 1b, respectively), and a second encoded qubit 222, with a pair of tunable physical superconductor qubits 204c, 204d (also referred to herein as 2a, 2b, respectively). For example, each physical superconductor qubit 204a-204d can be a tunable transmon, such as an xmon or a gatemon. Although the xmon geometry has been illustrated and discussed in detail below, the teachings disclosed herein can be applied to other types of superconducting qubits, such as, but not limited to, traditional transmons or capacitively-shunted flux qubits.

Each encoded qubit 202, 222 can have states $|0\rangle_Q = |01\rangle$ and $|1\rangle_Q = |10\rangle$. Each physical superconducting qubit 204a-204d can have a respective control interface 210 (e.g., z-control line) that tunes the Josephson energy $E_J$ thereof. No additional microwave xy-control lines are needed. Rather, all manipulation of the physical superconducting qubit states is done by the z-control pulses via interface 210. Each transmon is capacitively coupled to neighboring transmons (e.g., via coupling 206, 216, 226) and also coupled to, as an example, a transmission line resonator (e.g., 214a-214d) for readout.

A transmon qubit can be described by the charge qubit Hamiltonian $$H_X = 4E_C(\hat{n} - n_g)^2 - E_J \cos\hat{\theta}, \quad (1)$$

where $E_C = e^2/2C_\Sigma$ is the electron charging energy for total capacitance $C_\Sigma$ and $E_J$ is the Josephson energy. $\hat{n}$ and $\hat{\theta}$ are the number and phase operators, respectively, and $n_g$ is the gate charge number that can be tuned by a capacitively-coupled external voltage. The qubit frequency $f_Q = \varepsilon/h$ where $\varepsilon$ is the energy difference between the first excited state and the ground state, and $f_Q \approx \sqrt{8E_C E_J}/h$ in the transmon regime, $E_J \gg E_C$.

Figure 2B:
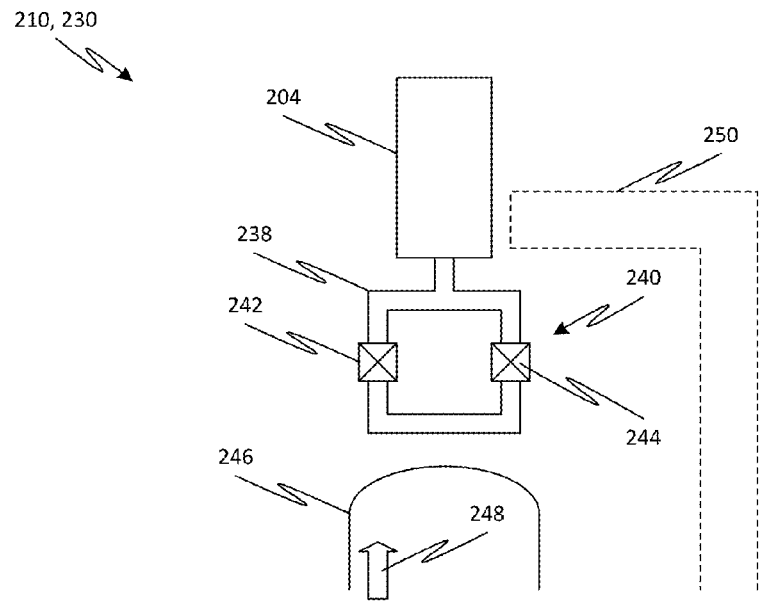
FIG. 2B is a simplified schematic diagram of a first control setup for a superconducting physical qubit, according to one or more embodiments of the disclosed subject matter.

The Josephson energy of a Josephson junction (JJ) is determined by the material properties and geometry of the JJ. However, the JJ of the physical superconducting qubit can be considered tunable (with respect to its frequency) by controlling a magnetic field or gate voltage applied to a tunable portion of the qubit. For example, in a first exemplary configuration illustrated in FIG. 2B, a control setup 210, 230 for providing tunability to physical qubit 204 includes a loop 238 with a pair of JJs 242, 244 (i.e., similar to a superconducting quantum interference device (SQUID)) that act as a tunable JJ 240. An externally applied magnetic flux through the double JJ loop 238 can tune the effective coupling energy $E_J = E_{J0} \cos(\pi \Phi_{ext}/\Phi_0)$, where $\Phi_{ext}$ is the external magnetic flux and $\Phi_0$ is the superconductor flux quantum. The externally applied magnetic field can be generated by a current flowing in a direction 248 through current wire 246. In addition, one of the JJs (e.g., transmons 204) can be provided with a separate voltage control 250 to tune the gate charge number $n_g$ thereof in order to initialize the encoded qubit state.

Figure 2C:
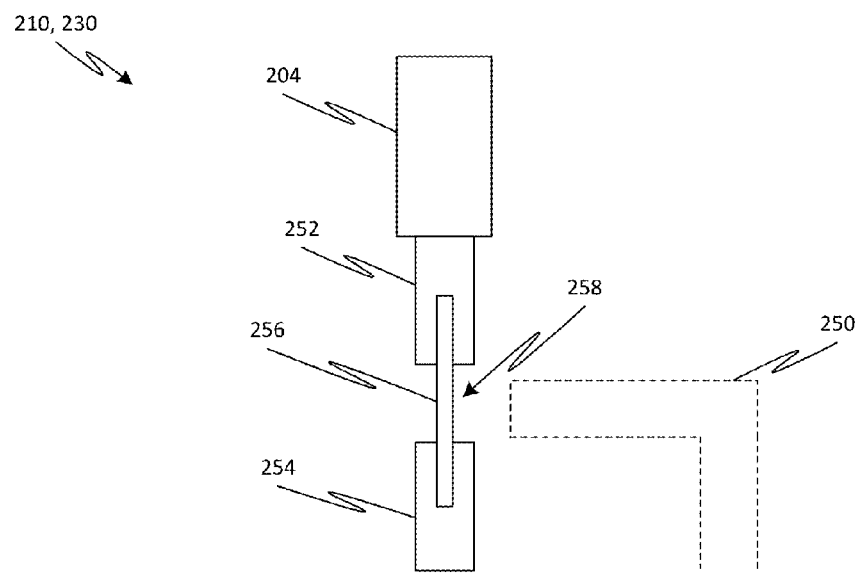
FIG. 2C is a simplified schematic diagram of a second control setup for superconducting physical qubit, according to one or more embodiments of the disclosed subject matter.

In a second exemplary configuration illustrated in FIG. 2C, a control setup 210, 230 for providing tunability to physical qubit 204 includes a superconductor-semiconductor junction (e.g., a gatemon) to which a side gate voltage is applied via control line 250. For example, a superconductor-coated semiconductor bridge 256 (e.g., a nanowire or other epitaxial formation) with an exposed portion 256 extending between a pair of JJs 252, 254. The JJ energy $E_J$ is tuned by a side-gate voltage $V_G$, which can also serve as capacitive tuning for initialization. For example, the bridge 256 can be an InAs nanowire that connects superconductors 252, 254, which are formed of Al. The nanowire 256 can be epitaxially coated with Al and a small portion 258 of the wire can be etched away to form a semiconductor nanowire bridging the superconductors 252, 254. A side-gate voltage can be used to tune the carrier density under the exposed portion of the wire and thus the Josephson energy of the JJ 204. Alternatively, the junction could be a 2-D superconductor-semiconductor junction (rather than a nanowire) or a graphene junction (rather than InAs).

In another alternative (not shown), the voltage control tunability can be provided via a tunable metal gate, such as a Cooper-pair box, instead of using a superconductor-semiconductor junction. However, the superconductor-semiconductor junction may enjoy certain advantages over the Cooper-pair box or the SQUID-like approach. For example, such superconductor-semiconductor systems may improve noise properties in addition to the tunability features described below. Moreover, it utilizes only a single JJ that can be quickly tuned by an electrostatic voltage. It also removes the need for external flux, thus reducing dissipation by a resistive control line and allowing the device to operate in a magnetic field.

The encoded qubit can be defined in a two-transmon system, where the Hamiltonian for the two transmons with capacitive xx coupling (e.g., coupling 206, coupling 216, or coupling 226 in FIG. 2A) is given by:

$$H_{2X} = \sum_{k=a,b} \left[ 4E_C^{(k)}(\hat{N}_k - n_g^{(k)})^2 - E_J^{(k)} \cos\hat{\theta}_k \right] + \quad (2)$$
$$E_{CC}(\hat{N}_a - n_g^{(a)})(\hat{N}_b - n_g^{(b)})$$
$$= \varepsilon_a \tilde{\sigma}_a^z + \varepsilon_b \tilde{\sigma}_b^z + \varepsilon' \tilde{\sigma}_a^x \otimes \tilde{\sigma}_b^x,$$

where $E_{CC}$ is the capacitive coupling energy and $\tilde{\sigma}_k^i$ (i=x, y, z) is the Pauli operator for the k-th transmon in a reduced subspace of transmon qubit states. $\varepsilon_k$ is the qubit energy of the k-th transmon, and $\varepsilon' = E_{CC} \alpha_a \alpha_b$ with $\alpha_k = \langle 1|\hat{N}_k|0\rangle$ where $|0\rangle$ and $|1\rangle$ are the two lowest energy states of individual transmons.

In a transmon qubit systems employing capacitive coupling, the coupling can be selectively turned on or off by appropriately tuning the qubit frequency to on resonance (coupling on) or off resonance (coupling off). The capacitive xx coupling conserves the parity $\tilde{\sigma}_a^z \otimes \tilde{\sigma}_b^z$ of the two transmon system, and the Hamiltonian of Eqn. 2 is block diagonal in the basis of $\{|00\rangle, |01\rangle, |10\rangle, |11\rangle\}$. The encoded qubit can be defined in the subspace of $\langle \{|01\rangle, |10\rangle\} \rangle$, since the other subspace $\langle \{|00\rangle, |11\rangle\} \rangle$ has states with a very large energy difference (much larger than the capacitive coupling), effectively turning off the capacitive coupling all the time.

In the encoded qubit basis $\{|0\rangle_Q, |1\rangle_Q\}$ where $$|0\rangle_Q = |01\rangle,$$
$$|1\rangle_Q = |10\rangle, \quad (3)$$

the single qubit Hamiltonian is given by:

$$H_Q = \begin{pmatrix} -\varepsilon_a + \varepsilon_b & \varepsilon' \\ \varepsilon' & \varepsilon_a - \varepsilon_b \end{pmatrix} \quad (4)$$
$$= \frac{\varepsilon_a + \varepsilon_b}{2} \mathbb{1} + \Delta\varepsilon \hat{\sigma}^z + \varepsilon' \hat{\sigma}^x$$

where $\Delta\varepsilon = (\varepsilon_b - \varepsilon_a)/2$ and $\hat{\sigma}^i$ (i=x, y, z) is the Pauli operator for the encoded qubit. The qubit energies $\varepsilon_a$ and $\varepsilon_b$ can be controlled by the tunable JJ (e.g., control interfaces 210, 230 in FIGS. 2A-2C) of each tunable transmon or gatemon, enabling logical gate operations with, for example, fast DC-like voltage or flux pulses instead of microwave signals.

Turning to FIG. 4, a high-level process flow diagram 400 for microwave-free control of a superconducting quantum computer is shown. Referring to 402, a quantum computer is provided with at least a pair of superconducting physical qubits that can be selectively coupled together and form one or more encoded qubits for use in performing a quantum computation. The encoded qubit(s) and associated superconducting physical qubits can be as described above with respect to FIGS. 1-2C or as otherwise described herein. At 404, the superconducting physical qubits can be initialized, for example, as described in further detail below with respect to FIGS. 5A-5D. At 406, quantum computation can be performed using the encoded qubit(s), which may be a plurality of encoded qubits that are selectively coupled together. The quantum computation can include single-qubit operations (i.e., by a single encoded qubit), such as described in further detail below with respect to FIGS. 3A-3D, or two-qubit operations (i.e., by a pair of encoded qubits), such as described in further detail below with respect to FIGS. 6A-8. Indeed, to enable universal quantum computation, there should be the capability within the system for any arbitrary single qubit operations and at least one two-qubit entangling gate operation. At 408, the process can detect a result of the quantum computation by measuring a state of the superconducting physical qubits. Any standard method can be employed to measure the states of the superconducting physical qubits. For example, a dispersive measurement method can be used, as discussed in further detail below.

The following describes logical gate operations (single-qubit and two-qubit operation), initialization, and measurement schemes for the exemplary encoded qubit architecture of FIG. 2A. Although the teachings are presented with respect to a particular quantum computing architecture, embodiments of the disclosed subject matter are not limited thereto and the teachings presented herein can be extended to other architectures or configurations.

Figure 3A:
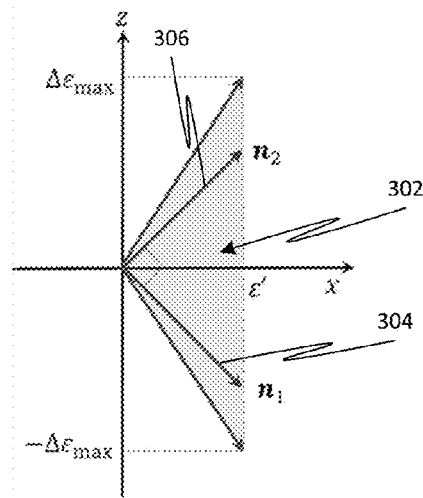
FIG. 3A is a graph illustrating possible rotation axes in the x-z plane for single qubit operation.

Turning initially to single-qubit operations, the Hamiltonian for an encoded qubit is given by Eqn. (4). For a fixed capacitive coupling between superconducting physical qubits, $\varepsilon'$ is fixed, and the single qubit operations can be implemented by pulsing the qubit energy $\varepsilon$ through the z-control of individual transmons, in at most three rotations. Since the tunable range of $\Delta\varepsilon$ (order of GHz) is much greater than $\varepsilon'$ (tens or hundreds of MHz), the rotation axis can be in almost any direction in the right half of the xz plane, as illustrated in FIG. 3A, and most logical single qubit gates can be implemented in two rotations. The shaded region 302 in FIG. 3A represents the range of the direction of possible rotation axes. In general, all single qubit gate operations can be implemented as a three-step Euler angle rotations around two orthogonal rotations axes (e.g., axis 304 and axis 306 in FIG. 3A).

Figure 3B:
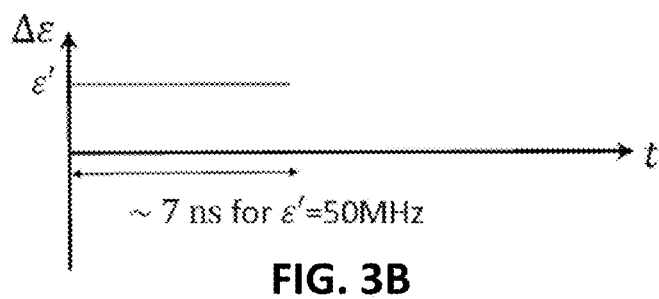
FIG. 3B is a graph illustrating a particular pulse shape to provide a Hadamard gate, according to one or more embodiments of the disclosed subject matter.
Figure 3C:
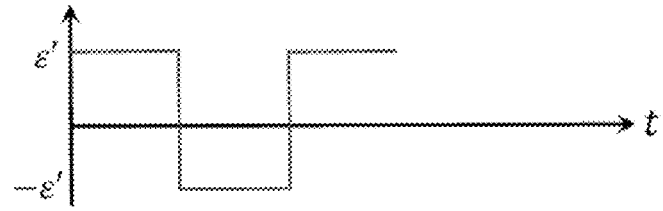
FIG. 3C is a graph illustrating a particular pulse shape to provide an X gate, according to one or more embodiments of the disclosed subject matter.
Figure 3D:
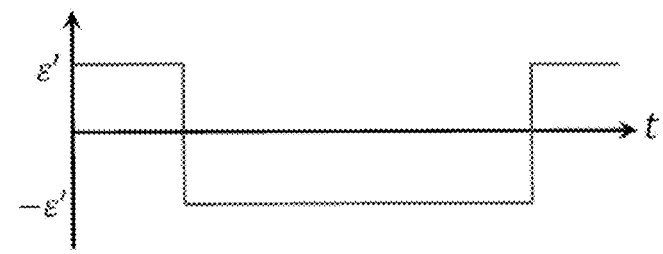
FIG. 3D is a graph illustrating a particular pulse shape to provide a Z gate, according to one or more embodiments of the disclosed subject matter.

For example, FIGS. 3B-3D show implementations of logical gates in terms of rotation around $\hat{n}_1 = n_1/|n_1|$ and $\hat{n}_2 = n_2/|n_2|$, in particular, the pulse shapes for a Hadamard gate, a Pauli X gate, and a Z gate, respectively. The Hadamard gate, $H = ((1,1),(1,-1))/\sqrt{2}$ is a single qubit gate that can be implemented as a single rotation $H = iR(\hat{n}_2, \pi)$ around $\hat{n}_2 = (1,0,1)/\sqrt{2}$ as illustrated in FIG. 3B. It can be achieved by tuning $\delta\varepsilon = \varepsilon'$. Here $R(\hat{n}, \phi)$ is a rotation by angle $\phi$ around $\hat{n}$ axis. The Pauli X gate can be realized as a single rotation by turning the two xmons (e.g., superconducting physical qubits 204a and 204b in FIG. 2A) on resonance ($\Delta\varepsilon = 0$), or three-step rotations such as $X = iR(\hat{n}_2, \pi/2)R(\hat{n}_1, \pi/2)R(\hat{n}_2, \pi/2)$ where $\hat{n}_1 = (1,0,-1)/\sqrt{2}$ and $\hat{n}_2 = (1,0,1)/\sqrt{2}$ as shown in FIG. 3C. The Z gate can be implemented using three-step rotations: $Z = iR(\hat{n}_2, \pi/2)R(\hat{n}_1, 3\pi/2)R(\hat{n}_2, \pi/2)$, as illustrated in FIG. 3D.

The above examples are for ideal systems with precise control over the system parameters. In real systems with fluctuating parameters, dynamical error-canceling pulse sequences could be useful for gate operations with higher fidelity. Given that single qubit gates in transmon systems through z-control have already demonstrated fidelities better than 0.999, it is expected that the logical single qubit gates, which require at most three rotation steps through z control of the physical qubits, will be able to reach a fidelity better than $F_1 \geq F_z^3 = 0.999^3 = 0.997$ using currently available experimental techniques.

Turning to two-qubit operations, for a scalable qubit architecture, the superconducting physical qubit frequencies can be chosen such that unnecessary resonances are avoided, especially if the two-qubit interaction cannot otherwise be completely shut off (e.g., complete shutoff using a tunable coupler). An encoded qubit has two superconducting physical qubits with idle frequency difference much larger than the capacitive coupling between them, so that the coupling can effectively be turned off. Thus, in a two encoded qubit system (such as system 200 in FIG. 2A, with first encoded qubit 202 and second encoded qubit 222), the idle frequencies of next-nearest neighbor transmons (e.g., superconducting physical qubits 204a-204d that are adjacent to each other) can be different by more than the direct capacitive coupling between them, which is on the order of MHz. The encoded qubit frequencies $\Delta \varepsilon$ of the neighboring encoded qubits 202, 222 can also be set to be different so as to mitigate at least some unintended resonances.

For the following calculations, the four superconducting physical qubit idle) frequencies $f_Q^{(k)}$ were set as 5.6, 4.6, 5.9, 4.8 GHz for k=1a (qubit 204a), 1b (qubit 204b), 2a (qubit 204c), 2b (qubit 204d), respectively. In the following calculations, $E_C^{(k)}/h=375$ MHz and $E_{CC}=300$ MHz was set for all physical qubits. Superconducting physical qubit frequencies can be controlled by tuning $E_J^{(k)}$.

Two qubit operations can be implemented by adopting the adiabatic two-qubit CPHASE operations between two superconducting physical qubits. By tuning the qubit frequencies of two physical qubits such that (11) and (02) states become resonant and then bringing them back to their idle frequencies, a unitary gate equivalent to the CPHASE gate between two qubits up to single qubit unitary gates can be achieved, which can yield a fidelity better than 0.99.

Figure 6A:
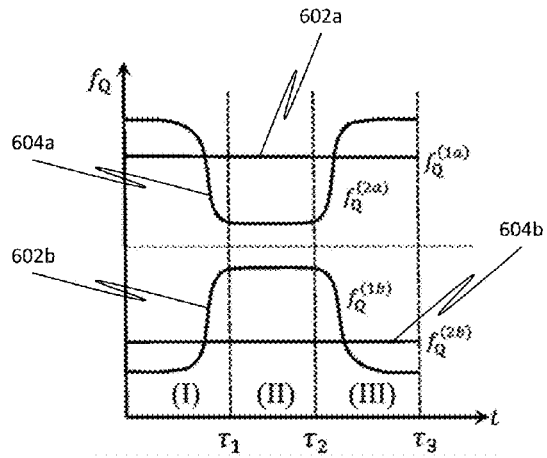
FIG. 6A illustrates a pulse scheme for two encoded qubit gate operations, according to one or more embodiments of the disclosed subject matter.

In a similar manner, the CPHASE gate between two encoded qubits can be implemented up to single qubit unitary gates. FIG. 6A shows schematically the pulse sequence of the superconducting physical qubit frequencies, changing the qubit frequencies of transmon 1b (qubit 204b) and transmon 2a (qubit 204c) in FIG. 2A. In FIG. 2A, the Y-axis ($f_Q$) is the qubit frequencies of each physical qubit, and $f_k^{(0)}$ is the idle frequency of the k-th physical qubit. Curves 602a, 602b form a first encoded qubit (e.g., encoded qubit 202 in FIG. 2A) and curves 604a, 604b form a second encoded qubit (e.g., encoded qubit 222 in FIG. 2A). The physical qubits 1b and 2a are brought close to resonance while still far from being resonant with other physical qubits (e.g., 1a and 2b), then are brought back to their respective idle frequencies.

Figure 6B:
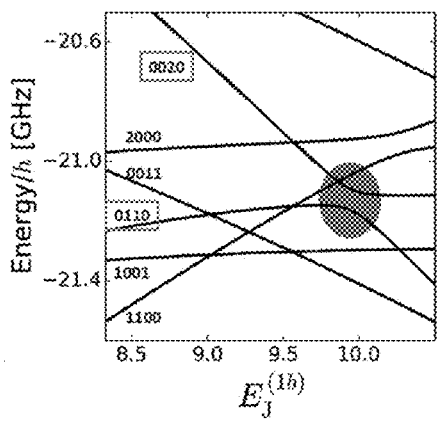
FIG. 6B is a graph of the energy spectrum during the process of FIG. 6A.

FIG. 6B is a graph of the energy spectrum during the process of FIG. 6A. The system is brought to the shaded area where (0110) and (0020) states are mixed. The (0110) state accumulates nontrivial phase during this process, which leads to a CPHASE gate between physical qubit 1b and physical qubit 2a, which yields a non-trivial two-qubit gate necessary for universal quantum computing. More specifically, the physical qubits 1b and 2a are first brought closer during time $\tau_1$ such that (0110) and (0020) states are on resonance in step (I). Then, in step (II), they stay there for a time period $\tau_{12}=\tau_2-\tau_1$. Finally, the physical qubits 1b and 2a are brought back to initial point at time $\tau_3=\tau_2+\tau_1$ in step (III). The (0110) state gets mixed with (0020) due to the capacitive coupling during the pulse sequence with strength $\sqrt{2}\varepsilon'$. During this process the (0110) state obtains some nontrivial phase due to the interaction with (0020) while the other qubit states, (0101), (1001), and (1010), obtain only trivial phases since they don't get close to any other states that can mix. This process results in a unitary operation in the encoded qubit space, up to a global phase:

$$U = \begin{pmatrix} e^{i\phi_2} & 0 & 0 & 0 \\ 0 & e^{i(\phi_2+\phi_3+\delta\phi)} & 0 & 0 \\ 0 & 0 & 1 & 0 \\ 0 & 0 & 0 & e^{i\phi_3} \end{pmatrix} \quad (5)$$

This is equivalent to the CPHASE gate $(1, 1, 1, e^{i\delta\Phi})^T$ up to single qubit operations.

$$CPHASE = \left[\begin{pmatrix} 0 & 1 \\ e^{-i\phi_2} & 0 \end{pmatrix} \otimes \begin{pmatrix} 1 & 0 \\ 0 & 1 \end{pmatrix}\right] \times U \times \left[\begin{pmatrix} 0 & 1 \\ 1 & 0 \end{pmatrix} \otimes \begin{pmatrix} 1 & 0 \\ 0 & e^{-i\phi_3} \end{pmatrix}\right] \quad (6)$$

Note that both physical qubits 1b and 2a (e.g., 202b and 202c in FIG. 2A) are tuned instead of tuning only one of them. If only one of the qubits is tuned, for example, tuning physical qubit 2a to bring the (0110) state close to the (0020) state, then physical qubit 2a (e.g., 202c in FIG. 2A) and physical qubit 2b (e.g., 202d in FIG. 2A) would be close to resonance. Because the transmon-transmon interaction through capacitive coupling can be turned on and off by bringing the transmons on and off resonance, this will result in a complicated, unintended operation as well as leakage. Accordingly, the physical qubits 1b and 2a can be tuned at the same time to avoid unintended interactions with physical qubits 1a and 2b.

The resonance between next-nearest neighbors can also lead to some small anti-crossing, but these resonances only occur during the fast ramping up and down steps and thus can be negligible. This scheme may be preferable to directly using the xx coupling between physical qubits 1b and 2a. In particular, the xx coupling may drive the system outside of the encoded qubit space, and hence lead to leakage and require a rather long sequence of pulse gates to implement a two-qubit logical operation.

Figure 7A:
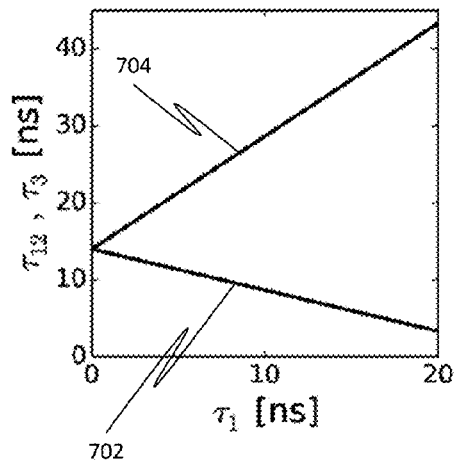
FIG. 7A is a graph of simulated numerical results of operation time to implement a CZ gate, according to one or more embodiments of the disclosed subject matter.
Figure 7B:
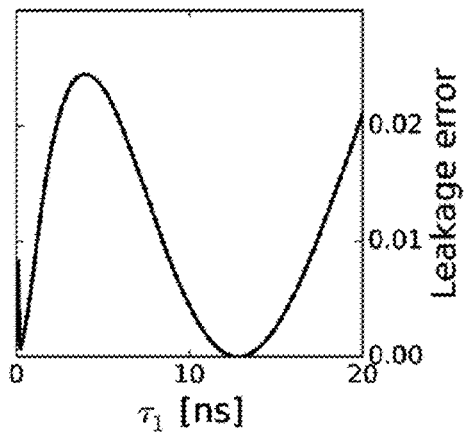
FIG. 7B is a graph of simulated numerical results of leakage error during the CZ interaction operation, according to one or more embodiments of the disclosed subject matter.
Figure 7C:
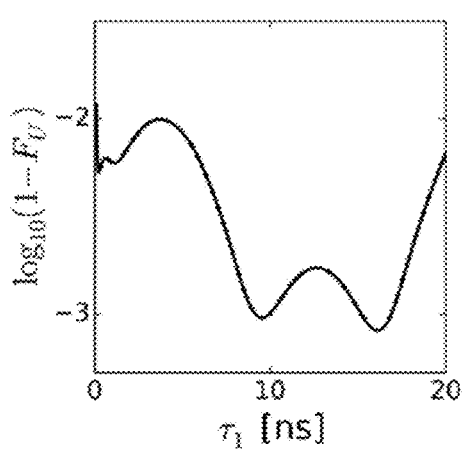
FIG. 7C is a graph of simulated numerical results of gate fidelity in terms of Makhlin invariants, according to one or more embodiments of the disclosed subject matter.
Figure 7D:
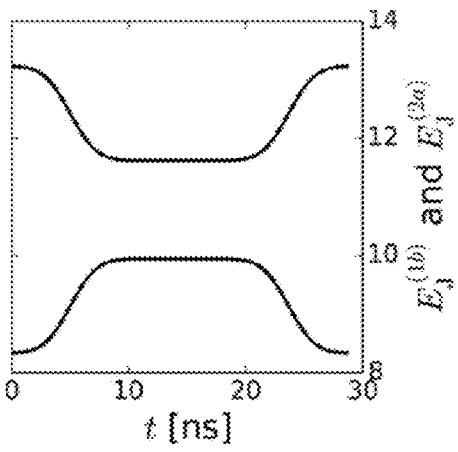
FIG. 7D is a graph of respective pulse shapes for $\tau_1=10$ ns, according to one or more embodiments of the disclosed subject matter.

Turning to FIGS. 7A-7D, simulated numerical results are shown for the above noted two qubit interaction between physical qubits 1b and 2a. FIG. 7A is a graph of simulated numerical results of operation time to implement a CZ gate, where curve 702 is the staying time $\tau_{12}=\tau_2-\tau_1$ and curve 704 is the total time $\tau_3$. FIG. 7B is a graph of simulated numerical results of leakage error during the CZ interaction operation. FIG. 7C is a graph of simulated numerical results of gate fidelity in terms of Makhlin invariants, which gives a measure of how close the unitary gate is to the CZ gate up to single qubit operations. FIG. 7D is a graph of respective pulse shapes for $\tau_1=10$ ns, where error functions were used to model a smooth pulse shape for $E_J^{(1b)}$ and $E_J^{(2a)}$.

The error function shape was used for ramping up and down:

$$E_J^{(1b)}(t) = \begin{cases} E_{J0}^{(1b)} + \frac{E_{res}^{(1b)} - E_{J0}^{(1b)}}{2}\left(1 + \text{erf}\left(\frac{t - \tau_1/2}{\sqrt{2}\,\sigma}\right)\right) & \text{(I)} \\ E_{res}^{(1b)} & \text{(II)} \\ E_{res}^{(1b)} - \frac{E_{res}^{(1b)} - E_{J0}^{(1b)}}{2}\left(1 + \text{erf}\left(\frac{t - \tau_1/2 - \tau_2}{\sqrt{2}\,\sigma}\right)\right) & \text{(III)} \end{cases} \quad (7)$$

and $E_J^{(2a)}(t) = E_{J0}^{(1b)} + E_{J0}^{(2a)} - E_J^{(1b)}(t)$. $E_{J0}$ is the idle value and $E_{res}$ is for resonant (11) and (02) states. To find optimal solutions of this form, $\tau_1$ was changed and $\sigma = \tau_1/4\sqrt{2}$ was chosen. $\tau_{12} = \tau_2 - \tau_1$ is calculated analytically using a perturbative expression such that the whole process will result in the U with desired $\delta\phi$. FIG. 7A shows $\tau_{12}$ and total time $\tau_3$ needed to implement a CZ gate ($\delta\phi = \pi$).

Due to the mixing with higher energy states which are out of the encoded qubit space, leakage error could pose a problem. The leakage error can be computed as follows. The full unitary operation matrix U can be written in a block form:

$$U = \begin{pmatrix} U_{AA} & U_{AB} \\ U_{BA} & U_{BB} \end{pmatrix} \quad (8)$$

where A is the encoded qubit subspace and B is the complementary subspace. For any qubit state $|\psi_A\rangle$ in the encoded qubit space, the leaked portion is $U_{BA}|\psi_A\rangle$ and $\|U_{BA}|\psi_A\rangle\|^2 = \langle\psi_A|U_{BA}^\dagger U_{BA}|\psi_A\rangle \equiv \langle\psi_A|W_{AA}|\psi_A\rangle$. $W_{AA} = U_{BA}^\dagger U_{BA}$ is positive definite and the leakage error $E_{leak}$ can be defined as $\max\langle\psi_A|W_{AA}|\psi_A\rangle = \max_\lambda\{w_\lambda\}$, where $w_\lambda$ are the eigenvalues of $W_{AA}$. The leakage error can be a few percent, but if an optimal $\tau_1$ is chosen it can be significantly reduced to well below 1%. Alternatively or additionally, the leakage can be dealt with algorithmically.

FIG. 7C shows the fidelity of two-qubit unitary gate U from a numerical simulation of the procedure. The fidelity of the unitary gate was defined as:

$$F_U = 1 - [f_1(U_{CZ}) - f_1(U)]^2 - [f_2(U_{CZ}) - f_2(U)]^2 \quad (9)$$

where $f_1$ and $f_2$ are the two Makhlin invariants for two-qubit gates. Makhlin invariants are identical for different two-qubit unitary gates if they are equivalent up to single qubit operations. Fidelity better than 99% is achievable for $\tau_1 \simeq 10$ ns, which also leads to very small leakage. FIG. 7D shows the pulse shape of $E_J^{(1b)}$ and $E_J^{(2a)}$ for $\tau_1 = 10$ ns. The total time duration for the whole process is about 30 ns. In real devices, the fidelity may be lower due to other sources of noise, but optimization of pulse shapes rather than the simple forms considered here may yield improved fidelity. Gaussian shaped pulses were also considered and yielded similar results.

The realistic fidelity of the encoded CPHASE gate constructed here can be estimated from the fidelities of the z-control pulses and the adiabatic process. Since any single qubit logical gate involves at most three rotations (i.e., three pulse steps), the encoded CPHASE gate requires at most 12 pulse steps. Assuming the z pulse fidelity of 0.999 and a fidelity of the adiabatic gate U in Eqn. (6) between two transmons of about 0.99, the fidelity of the total process can be estimated to be better than $F_2 > 0.999^{12} \times 0.99 \simeq 0.978$.

Better optimization or different sequences may improve the fidelity. The already demonstrated physical CPHASE gate fidelity of 0.99 also includes a single adiabatic operation and single qubit corrective operations, so the encoded CPHASE gate should be achievable with a similar fidelity. An encoded CNOT gate can be implemented with CPHASE gate and single qubit gates, and similar fidelity for the CNOT gate can be expected.

Figure 8:
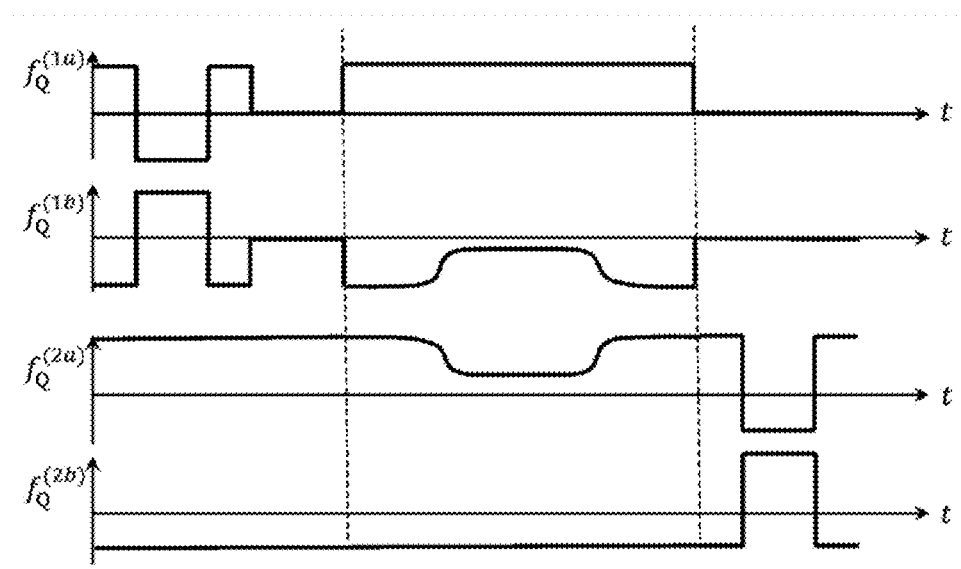
FIG. 8 is a graph of pulse sequence for encoded CPHASE operation, according to one or more embodiments of the disclosed subject matter.

FIG. 8 schematically depicts a sequence of DC pulses for the logical CPHASE gate, using the expression in Eqn. (6). The single qubit phase gate is implemented with three step Euler rotations, and Pauli X and identity gates are implemented as a single rotation. The two vertical dashed lines separate single qubit gates and two-qubit adiabatic operation. In FIG. 8, the first three pulses in the first encoded qubit (top two curves) (e.g., encoded qubit 202 in FIG. 2A) implement a phase gate and the next resonant pulse realizes a Pauli X gate. The second encoded qubit (bottom two curves) (e.g., encoded qubit 222 in FIG. 2A) is pulsed to qubit frequencies such that the second encoded qubit rotates by $2n\pi$ to implement the identity operation. Then the two-qubit adiabatic gate between physical qubits 1b and 2a is applied. After that, an X gate is applied to the first encoded qubit as a single resonant pulse step and a phase gate is applied to the second encoded qubit in three rotations. This particular implementation of CPHASE contains only 9 single qubit operations, better than the general 12 single qubit gates discussed above.

The choice of encoded qubit discussed above has been for the sake of simplicity and straightforward incorporation of physical qubit operations into logical gate operations. Other choices are also possible according to one or more contemplated embodiments. For example, an alternative choice, $(|01\rangle \pm |10\rangle)/\sqrt{2}$ in the same subspace can be selected. With this encoded qubit, the constant capacitive coupling leads to a constant energy gap between encoded qubit states, and the z control of each physical qubit allows tunable $\hat{\sigma}^x$ operation. Single-qubit logical gates can be implemented in a similar way, and the adiabatic two-qubit operation will need additional single-qubit unitary gates to transform to the CPHASE gate due to the basis change of the encoded qubit.

Turning to initialization, the scheme disclosed below may utilize only fast DC pulses. The ground state of the two qubit system is $|00\rangle$, which is not in the encoded qubit subspace defined by Eqn. (3). To initialize the system into $|0\rangle_Q = |01\rangle$ without microwave control, a process similar to the Landau-Zener (LZ) tunneling can be used. For this procedure, the gate charge $n_g^{(b)}$ of the second transmon should be tunable, which can be provided by connecting a capacitor with a voltage control to the physical qubit (see FIG. 2B) or by using the side-gate for gatemons.

Figures 5C, 5D:
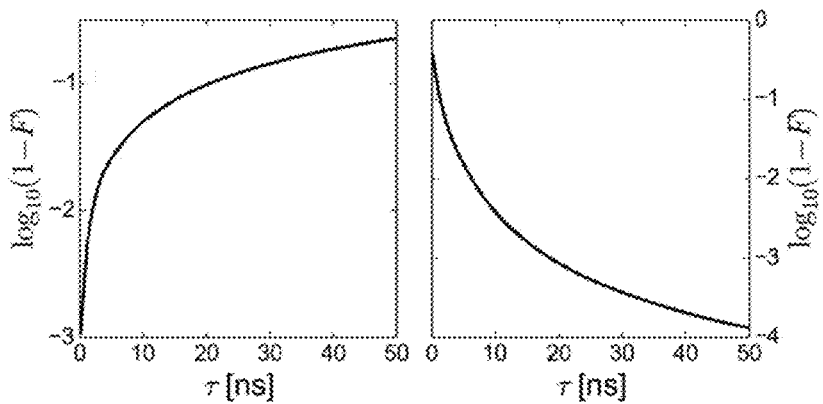
FIGS. 5C-5D are graphs illustrating the fidelity of the initialization processes of FIGS. 5A-5B, respectively, as a function of total time duration, according to one or more embodiments of the disclosed subject matter.

An initialization process is illustrated in FIGS. 5A-5D, where FIGS. 5A-5B are energy spectrum diagrams for an encoded qubit with the second physical qubit in the charge qubit regime and FIGS. 5C-5D are graphs illustrating the fidelity of the initialization processes of FIGS. 5A-5B, respectively, as a function of total time duration. First, the physical qubit is tuned into the charge qubit regime where $E_J^{(b)}$ is much smaller than $E_C^{(b)}$ by tuning $\Phi_{ext}$ (or $V_g$ for a variable super-semi JJ) with $n_g^{(a)} \simeq 0$. Then, via thermalization (e.g., by waiting the relaxation time or by coupling to a dissipative reservoir) the qubit reaches the ground state 502, as shown in FIG. 5A. Alternatively, the thermalization could be done before tuning to the charge qubit regime. In this charge qubit regime, the two lowest energy states anticross at a sweet spot of $n_g^{(b)} = 0.5$. By changing the gate charge $n_g^{(b)}$ from 0 to a value larger than 0.5, LZ tunneling can be induced to prepare the charge qubit in the first excited state 504, as shown in FIGS. 5A-5B. Then, the qubit is adiabatically moved into the transmon regime 506 by increasing $E_J^{(b)}$, i.e., back to the operating transmon regime ($E_J^{(b)} \gg E_C^{(b)}$) as shown in FIG. 5B. If $E_J^{(b)}$ is tuned exactly to zero, then there is a crossing instead of anti-crossing, and the fidelity will be much better. However, some finite value can be allowed as long as $n_g^{(b)}$ is changed sufficiently fast.

FIG. 5C shows the calculated fidelity of the LZ tunneling in the charge qubit regime of FIG. 5A as a function of the total time $\tau$ taken to change $n_g^{(b)}$. Here fidelity is defined as $F=|\langle \Psi_{target}|\Psi_{final}\rangle|$. The system parameters chosen for the calculations are readily available in current systems, e.g., $E_C^{(a)}/h=E_C^{(b)}/h=375$ MHz, $E_J^{(a)}/h=12$ GHz, $E_J^{(b)}/h=50$ MHz, $E_{CC}=30$ MHz. $n_g^{(b)}$ was changed from 0 to 0.8. As is the case for typical LZ tunnelings, the fidelity is better with faster change of the parameter. For example, fidelity better than 99% should be achievable for a LZ process of a few ns. Tuning back to the transmon regime is essentially an adiabatic process, and the fidelity increases with slower change, as illustrated in FIG. 5D. When $E_J^{(b)}/h$ was changed from 50 MHz to 8.33 GHz, the fidelity was better than 99% for a process of a few tens of ns. So this initialization process will take ~20 ns to prepare the logical qubit state with fidelity of ~99%.

Other initialization schemes are also possible according to one or more contemplated embodiments. For example, in spin systems, the encoded qubit can be initialized fast and with high fidelity by loading pairs of electrons in the singlet state directly from the Fermi sea provided by the leads supplying the quantum dots, and then adiabatically separating the singlet into two dots. Electrons' fermionic and particle nature enables this. Superconducting physical qubits can emulate these properties, for example, by employing engineered many-body photonic systems. In another alternative, a two-qubit system could be designed where the ground state is a singlet, for example, by making the coupling between the two qubits much greater than the qubit splittings (and waiting for relaxation to the ground state). However, in order to do gates at an implementable speed in addition to on-off control of coupling between physical qubits, it would be desirable to move out of this regime after initialization.

Turning to measurement, since an encoded qubit is in a state:

$$|\Psi\rangle = \alpha|0\rangle_Q + \beta|1\rangle_Q = \alpha|01\rangle + \beta|10\rangle, \quad (10)$$

the encoded qubit can be measured by measuring either of the physical qubits using a standard method, such as dispersive measurement, which can be multiplexed. The choice of encoded qubit in Eqn. (3) allows translation of the single qubit state into the encoded qubit states. With a choice of a singlet-triplet-like encoded qubit states, $(|01\rangle \pm |10\rangle)/\sqrt{2}$ the encoded qubit state can also be measured after some single qubit gates are applied to turn them into the encoded qubit states as above, or they could be measured directly by dispersive measurement since these states correspond to different resonator frequencies.

Unlike the spin system where measurement of a singlet can be done electrostatically using a projective measurement, the dispersive measurement of superconducting physical qubits using a transmission line resonator still requires a microwave carrier. However, it is to be noted that while microwaves signals could be used for measurement, the control of gates of the physical qubits to effect operation in performing a quantum computation would still be microwave-free.

Other measurement approaches are also possible according to one or more contemplated embodiments. For example, the encoded qubit can be converted to another quantum system (or a measurement qubit) that is classically long-lived but can be read out digitally or with fast baseband pulses (e.g., a latched readout). In still another example, dispersive measurement could be employed using lower bandwidth lines. In such a measurement configuration, $E_J$ can be directly tuned or the qubit can be swapped with another qubit having a different frequency that can be readily measured.

In one or more embodiments, a "dual rail" superconducting quantum computer includes one or more encoded qubits, where each qubit is comprised of two tunable physical qubits. Encoded two-qubit operations are provided by only a single physical two-qubit gate and single qubit pulses. Since physical two-qubit gates are typically much more costly in time and fidelity, this means that the overhead of encoded operations as proposed herein is not significant, especially as compared to encoded qubits comprised of spin qubits.

Moreover, in the disclosed superconducting qubit architecture, manipulations of the qubit (e.g., in controlling the state to perform a quantum computation) are achieved solely by the z-control pulse sequences of individual physical qubits. This removes the requirement of microwave xy-control lines that were otherwise required in conventional transmon or similar superconducting qubit devices. The microwave-free control proposed herein greatly simplifies the control circuitry required for operation. In addition, the encoded approach may allow lower requirements for available bandwidth per line, the potential for less crosstalk, and a reduction in needed timing accuracy as the encoded qubit states are nearly degenerate.

In addition, removing the need for microwave control allows for the choice of qubit frequency to be independent of the cost and availability of control electronics, in particular microwave electronics. Superconducting physical qubits can thus be designed with higher (or much lower) frequency that might enable higher temperature qubit operation or qubits made from degenerate quantum circuits as in symmetry protected approaches.

Encoding a qubit in a two-dimensional subspace in a larger Hilbert space introduces leakage error. For the disclosed encoded qubits, the relaxation process of individual physical qubits will lead to leakage out of the encoded qubit space. For a single gate operation such as CNOT of duration $\tau$, the leakage error due to the $T_1$ process would be $1-\exp(-\tau/T_1) \approx 0.04\%$ for $\tau=40$ ns and $T_1=100$ μs, which would slightly reduce the error threshold for quantum error correction. While a single gate operation of a few tens of ns does not lead to significant leakage errors, a long sequence of gate operations in a large system can be problematic. For example, a single logical qubit for fault-tolerant quantum computing, such as the surface code, may have many encoded qubits. A logical operation will be a sequence of operations on those encoded qubits.

Leakage reduction units (LRU) can be used to mitigate the effect of leakage errors in larger systems. For example, a full-LRU based on one-bit teleportation can employ an ancillary qubit for each encoded qubit, as well as additional CNOT operations and measurements after each logical CNOT operation. Alternatively or additionally, qubits especially designed for large relaxation times, such as variants of uxonium, may be used in the encoded qubit approach (e.g., a $T_1$ time of 1 ms would lead to a leakage error per CNOT of $4 \times 10^{-5}$) and would reduce the overhead for leakage mitigation dramatically.

Alternatively or additionally, capacitively-shunted flux qubits (or "fluxmon") may be used to avoid or at least reduce leakage error effects in larger scale encoded qubit systems. The fluxmon has comparable coherence times and a larger anharmonicity than transmons. Qubit-qubit coupling through mutual inductance could also provide transversal xx coupling like the capacitive coupling between transmon qubits. Fluxmons also offer benefits for initialization as they can be tuned to the flux qubit regime down to very small qubit splitting while being protected to $T_1$ processes that flux qubits offer, and readout can also be done by using a DC SQUID without a transmission line.

Although particular types of qubits have been discussed herein, in particular the use of transmons, embodiments of the disclosed subject matter are not limited thereto. Indeed, the teachings herein applied to transmons can be extended to all types of qubits, such as, but not limited to, xmon, gatemon, flux, C-shunted flux, fluxonium, etc.

Moreover, although examples employing specific superconducting physical qubits have been discussed herein, other superconducting qubits can also be employed. For example, the qubits may be superconducting-semiconductor (super-semi) hybrids similar to the configuration illustrated in FIG. 2C. Indeed, the appearance of superconductivity in conventional semiconductors such as silicon or germanium could potentially allow for a new type of fully epitaxial super-semi devices.

Embodiments of the disclosed subject matter allow for the operating frequency of the qubits to be divorced from the required control electronics. Thus, the control electronics may operate at a much slower frequency (e.g., at least an order of magnitude or more) than the individual physical qubits due to the encoding. In other words, the operating frequency of the one or more physical qubits can be independent of the control electronics.

Embodiments of the disclosed subject matter are not limited to the particular configurations and variations disclosed above. Rather, the teachings presented herein can be extrapolated to provide additional embodiments of superconducting physical qubits for quantum computing. As noted above, the inventors have discovered that the application of an encoding qubit scheme to superconducting physical qubits yields unexpected results (e.g., reduced overhead) as compared to the use of an encoding qubit scheme with spin qubits. It is also appreciated that other properties of spin qubits may be mimicked in superconducting physical qubits to substantial and unexpected advantage, such as, but not limited to using very weak coupling between qubit states to charge noise and phonons, providing a fast and selective two-qubit gate via a Pauli exclusion like mechanism or an interaction that mimics it, achieving very large ON/OFF ratios, and/or fast initialization.

It will be appreciated that the aspects of the disclosed subject matter can be implemented, fully or partially, in hardware, hardware programmed by software, software instruction stored on a computer readable medium (e.g., a nontransitory computer readable medium) or a combination of the above.

For example, components of the disclosed subject matter, including components such as a controller, processor, or any other feature, can include, but are not limited to, a personal computer or workstation or other such computing system that includes a processor, microprocessor, microcontroller device, or is comprised of control logic including integrated circuits such as, for example, an application specific integrated circuit (ASIC).

Features discussed herein can be performed on a single or distributed processor (single and/or multi-core), by components distributed across multiple computers or systems, or by components co-located in a single processor or system. For example, aspects of the disclosed subject matter can be implemented via a programmed general purpose computer, an integrated circuit device (e.g., ASIC), a digital signal processor (DSP), an electronic device programmed with microcode (e.g., a microprocessor or microcontroller), a hard-wired electronic or logic circuit, a programmable logic circuit (e.g., programmable logic device (PLD), programmable logic array (PLA), field-programmable gate array (FPGA), programmable array logic (PAL)), software stored on a computer-readable medium or signal, an optical computing device, a networked system of electronic and/or optical devices, a special purpose computing device, a semiconductor or superconductor chip, a quantum computing chip or device, a software module or object stored on a computer-readable medium or signal.

When implemented in software, functions may be stored on or transmitted over as one or more instructions or code on a computer-readable medium. The steps of a method or algorithm disclosed herein may be embodied in a processor-executable software module, which may reside on a computer-readable medium. Instructions can be compiled from source code instructions provided in accordance with a programming language. The sequence of programmed instructions and data associated therewith can be stored in a computer-readable medium (e.g., a nontransitory computer readable medium), such as a computer memory or storage device, which can be any suitable memory apparatus, such as, but not limited to quantum-based memory, read-only memory (ROM), programmable read-only memory (PROM), electrically erasable programmable read-only memory (EEPROM), random-access memory (RAM), flash memory, disk drive, etc.

As used herein, computer-readable media includes both computer storage media and communication media, including any medium that facilitates transfer of a computer program from one place to another. Thus, a storage media may be any available media that may be accessed by a computer. By way of example, and not limitation, such computer-readable media may comprise RAM, ROM, EEPROM, CD-ROM or other optical disk storage, magnetic disk storage or other magnetic storage devices, quantum-based storage, or any other medium that may be used to carry or store desired program code in the form of instructions or data structures and that may be accessed by a computer.

Also, any connection is properly termed a computer-readable medium. For example, if the software is transmitted from a website, server, or other remote source using a transmission medium (e.g., coaxial cable, fiber optic cable, twisted pair, digital subscriber line (DSL), or wireless technologies such as infrared, radio, and microwave), then the transmission medium is included in the definition of computer-readable medium. Moreover, the operations of a method or algorithm may reside as one of (or any combination of) or a set of codes and/or instructions on a machine readable medium and/or computer-readable medium, which may be incorporated into a computer program product.

One of ordinary skill in the art will readily appreciate that the above description is not exhaustive, and that aspects of the disclosed subject matter may be implemented other than as specifically disclosed above. Indeed, embodiments of the disclosed subject matter can be implemented in hardware and/or software using any known or later developed systems, structures, devices, and/or software by those of ordinary skill in the applicable art from the functional description provided herein.

In this application, unless specifically stated otherwise, the use of the singular includes the plural, and the separate use of "or" and "and" includes the other, i.e., "and/or." Furthermore, use of the terms "including" or "having," as well as other forms such as "includes," "included," "has," or "had," are intended to have the same effect as "comprising" and thus should not be understood as limiting.

Any range described herein will be understood to include the endpoints and all values between the endpoints. Whenever "substantially," "approximately," "essentially," "near," or similar language is used in combination with a specific value, variations up to and including 10% of that value are intended, unless explicitly stated otherwise.

It is thus apparent that there is provided in accordance with the present disclosure, microwave-free control of a superconductor-based quantum computer. Many alternatives, modifications, and variations are enabled by the present disclosure. While specific examples have been shown and described in detail to illustrate the application of the principles of the present invention, it will be understood that the invention may be embodied otherwise without departing from such principles. For example, disclosed features may be combined, rearranged, omitted, etc. to produce additional embodiments, while certain disclosed features may sometimes be used to advantage without a corresponding use of other features. Accordingly, Applicant intends to embrace all such alternatives, modifications, equivalents, and variations that are within the spirit and scope of the present invention.

The invention claimed is:

1. A method comprising:
controlling operation of a superconductor-based quantum computer without using a microwave signal,
wherein the controlling operation of the quantum computer comprises controlling a state of one or more encoded qubits of the quantum computer without using a microwave signal, each encoded qubit comprising a pair of selectively-coupled superconducting physical qubits,
wherein the controlling the state of the one or more encoded qubits comprises applying z-pulses to control respective gates of the pair of selectively-coupled superconducting physical qubits, each z-pulse comprising a DC-based voltage or flux pulse, and
wherein the applied z-pulses change respective frequencies of the selectively-coupled superconducting physical qubits.

2. The method of claim 1, wherein
the selective coupling between superconducting physical qubits is provided by a tunable coupler, and the superconducting physical qubits of said pair have respective idle frequencies that are the same or differ from each other by no more than 20%.

3. The method of claim 1, wherein
the respective frequencies of the superconducting physical qubits are changed by at least one of:
controlling a magnetic field applied to a loop having a pair of Josephson junctions of the superconducting physical qubit; and
controlling a gate voltage applied to a superconductor-semiconductor junction or to a Cooper-pair box of the superconducting physical qubit.

4. The method of claim 1, wherein
respective states of a plurality of the encoded qubits are controlled without using a microwave signal, and
the z-pulse control implements entangling two-qubit operation between a pair of the plurality of encoded qubits so as to enable universal quantum computation.

5. The method of claim 1, wherein
the selective coupling between superconducting physical qubits is provided by a capacitive coupling that is controlled by tuning the respective frequencies of the corresponding superconducting physical qubits,
each superconducting physical qubit has a respective idle frequency, and
a difference between the idle frequencies of each pair of superconducting physical qubits is greater than the capacitive coupling between said pair.

6. The method of claim 1, wherein the controlling the state of the one or more encoded qubits is such that any single qubit gate operation can be implemented by the quantum computer as a three-step Euler angle rotation around two orthogonal rotation axes.

7. The method of claim 1, wherein the z-pulses are baseband DC voltage or flux signals.

8. A method comprising:
providing at least one encoded qubit, each encoded qubit comprising a pair of physical qubits capable of being selectively coupled together, each of the physical qubits of said pair having a respective tunable frequency; and
controlling the at least one encoded qubit to perform a quantum computation,
wherein the controlling includes microwave-free control of a state of the at least one encoded qubit by applying z-pulses to control respective gates of the pair of physical qubits, the z-pulses comprising DC-based voltage or flux pulses, and
wherein the applied z-pulses change respective frequencies of the physical qubits.

9. The method of claim 8, wherein at least one of the pair of physical qubits comprises a superconducting qubit.

10. The method of claim 8, wherein at least one of the pair of physical qubits comprises:
a superconducting qubit with a superconducting-quantum-interference-device-like (SQUID) tunable Josephson junction;
a superconducting qubit with a superconductor-semiconductor-based voltage tunable Josephson junction; or
a superconducting qubit with a Cooper-pair box.

11. The method of claim 8, wherein the controlling the at least one encoded qubit comprises arbitrarily rotating a state of the respective encoded qubit around the Bloch sphere.

12. The method of claim 8, wherein
the at least one encoded qubit is at least two encoded qubits, and
the z-pulse control implements entangling two-qubit operation between the two encoded qubits so as to enable universal quantum computation.

13. The method of claim 8, wherein the selective coupling between each pair of physical qubits is a capacitive coupling that is controlled by tuning the respective frequencies of the corresponding physical qubits.

14. The method of claim 13, wherein
each physical qubit has a respective idle frequency, and
a difference between the respective idle frequencies of each pair of physical qubits is greater than the capacitive coupling between said pair.

15. The method of claim 8, further comprising measuring one of the pair of physical qubits of the at least one encoded qubit.

16. The method of claim 15, wherein the measuring comprises a microwave-based dispersive measurement.

17. The method of claim 8, wherein the controlling to perform the quantum computation comprises:
   tuning the selective coupling between the pair of physical qubits of the at least one encoded qubit via a coupler between the pair of physical qubits or by tuning the respective frequencies of the pair of physical qubits; and/or
   tuning a coupling between adjacent encoded qubits.

18. The method of claim 8, wherein the quantum computation includes a single qubit gate operation that is implemented as a three-step Euler angle rotation around two orthogonal axes.

19. A quantum computing system comprising:
   at least one encoded qubit, each encoded qubit comprising a pair of physical qubits capable of being selectively coupled together, each of the physical qubits of said pair having respective tunable frequencies; and
   a controller configured to control a state of each of the pair of physical qubits to perform a quantum computation, wherein the controller is configured to control said state via microwave-free control signals by applying DC-based voltage or flux pulses to respective gates of the pair of physical qubits,
   wherein the applied pulses change respective frequencies of the physical qubits.

20. The quantum computing system of claim 19, wherein at least one of the pair of physical qubits comprises:
   a superconducting qubit having a superconducting-quantum-interference-device-like (SQUID) tunable Josephson junction;
   a superconducting qubit having a superconductor-semiconductor-based voltage tunable Josephson junction; or
   a superconducting qubit having a Cooper-pair box.

21. The quantum computing system of claim 19, wherein the controller is further configured to tune the selective coupling between the pair of physical qubits and/or tune coupling between encoded qubits.

22. The quantum computing system of claim 19, wherein the coupling between the pair of physical qubits is capacitive coupling.

23. The quantum computing system of claim 22, wherein
   each of the pair of physical qubits has a respective idle frequency, and
   a difference between the idle frequencies of the pair of physical qubits is greater than the capacitive coupling between said pair.

24. The quantum computing system of claim 19, further comprising a read-out system with a plurality of resonators, each of the physical qubits being selectively coupled to a respective one of the resonators.

25. The quantum computing system of claim 19, wherein the pair of physical qubits is constructed to allow arbitrary rotations of a state of the respective encoded qubit around the Bloch sphere.

* * * * *